United States Patent
Townsend, III et al.

(10) Patent No.: US 6,946,382 B2
(45) Date of Patent: Sep. 20, 2005

(54) PROCESS FOR MAKING AIR GAP CONTAINING SEMICONDUCTING DEVICES AND RESULTING SEMICONDUCTING DEVICE

(75) Inventors: Paul H. Townsend, III, Midland, MI (US); Kenneth L. Foster, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 10/505,511

(22) PCT Filed: Apr. 1, 2003

(86) PCT No.: PCT/US03/09956

§ 371 (c)(1),
(2), (4) Date: Aug. 24, 2004

(87) PCT Pub. No.: WO03/085719

PCT Pub. Date: Oct. 16, 2003

(65) Prior Publication Data

US 2005/0124172 A1 Jun. 9, 2005

Related U.S. Application Data

(60) Provisional application No. 60/369,490, filed on Apr. 2, 2002.

(51) Int. Cl.[7] .......................................... H01L 21/4763
(52) U.S. Cl. ........................................ 438/619; 438/637
(58) Field of Search ................... 438/46, 126, 238, 438/253, 400, 411, 423–425, 435, 439, 619, 623, 637

(56) References Cited

U.S. PATENT DOCUMENTS

| | | | |
|---|---|---|---|
| 4,987,101 A | 1/1991 | Kaanta et al. | 437/228 |
| 5,324,683 A | 6/1994 | Fitch et al. | 437/65 |
| 5,461,003 A | 10/1995 | Havemann et al. | 437/187 |
| 6,165,890 A * | 12/2000 | Kohl et al. | 438/619 |
| 6,350,672 B1 * | 2/2002 | Sun | 438/619 |
| 6,451,712 B1 | 9/2002 | Dalton et al. | 438/781 |
| 6,495,445 B2 * | 12/2002 | Clevenger et al. | 438/619 |
| 6,815,329 B2 * | 11/2004 | Babich et al. | 438/619 |
| 2004/0087133 A1 | 5/2004 | Kumar | 438/618 |

FOREIGN PATENT DOCUMENTS

WO 2004/041972 5/2004

OTHER PUBLICATIONS

Kohl, et al., IEEE Electron Device Letters, vol. 21, No. 12, Dec. 2000, p557–559.

IBM Technical Disclosure Bulletin, vol. 38, No. 9 Sep. 1995, p137–140.

* cited by examiner

*Primary Examiner*—Michael Lebentritt
*Assistant Examiner*—Andre C. Stevenson, Sr.

(57) ABSTRACT

A method of forming at least a partial air gap within a semiconducting device and the resulting devices, said method comprising the steps of: (a) depositing a sacrificial polymeric composition in one or more layers of the device during its formation; (b) coating the device with one or more layers of a relatively non-porous, organic, polymeric, insulating dielectric material (hardmask) having a density less than 2.2 g/cm$^3$; and (c) decomposing the sacrificial polymeric composition such that the decomposition products permeate at least partially through the one or more hardmask layers, thereby forming at least a partial air gap within the device.

13 Claims, 2 Drawing Sheets

Figure 1:
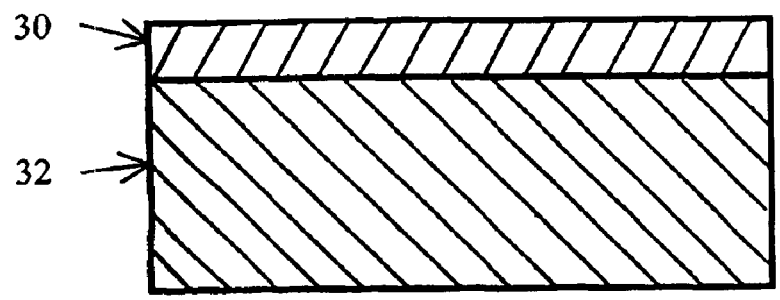

PROCESS FOR MAKING AIR GAP CONTAINING SEMICONDUCTING DEVICES AND RESULTING SEMICONDUCTING DEVICE

This applications claims benifit of 60/369,490 filed Apr. 2, 2002.

The invention herein described relates generally to the fabrication of semiconducting devices and more specifically to such devices that use air gaps to reduce capacitive coupling between conductors in such devices. Examples of semiconducting devices include the well known integrated circuits (ICs) as well as routers and switches for controlling electrical or optical signals.

As a consequence of the progress made in integrated circuit technology, the spacing between the metal lines on any given plane of an integrated circuit has become less and less, now extending into the submicrometer range. By reducing the spacing between conductive members in the integrated circuit, an increase in capacitive coupling occurs. This increase in capacitive coupling causes greater crosstalk, higher capacitive losses and increased RC time constant.

In order to reduce capacitive coupling, much effort has been directed toward developing low dielectric constant (low-K) materials to replace conventional dielectric materials that are interposed between the metal lines on a given layer and between layers. Many conventional electronic insulators have dielectric constants in the 3.5 to 4.2 range. For example, silicon dioxide has a dielectric constant of 4.2 and polyimides typically have dielectric constants from 2.9 to 3.5. Some advanced polymers have dielectric constants in the 2.5 to 3.0 range. Materials in the 1.8 to 2.5 range are also known.

The lowest possible, or ideal, dielectric constant is 1.0, which is the dielectric constant of a vacuum. Dehumidified air is almost as good with a dielectric constant of 1.001. With this recognition of the low dielectric constant of air, attempts have been made to fabricate semiconductor devices with air gaps between metal leads to reduce the capacitive coupling between the electrically conducting members. The air gap forming techniques that have been developed have varying degrees of complexity and include subtractive and damascene techniques.

U.S. Pat. No. 4,987,101 describes a method and structure for providing an insulating electrical space between two lines on a layer of material or between lines on adjacent layers of material. A base member is formed having a plurality of support members extending outwardly from the base member. A removable material is deposited on the base member and around the support members. A cap member of insulating material is then deposited over said support members and the removable material. Access openings are formed in at least one of the base member or the cap member communicating with the removable material. The removable material is removed through the access openings to thereby define a space between the cap member and the base member and between the support members. During this step a partial vacuum (in which some inert gas may be dispersed) may be created in the space vacated by the removable material. The access openings are then filled in so as to provide a sealed space between the cap member which has a very low dielectric constant.

U.S. Pat. No. 5,324,683 describes several techniques for forming air gaps or regions in a semiconductor device. The air regions are formed by either selectively removing a sacrificial spacer or by selectively removing a sacrificial layer. The air regions are sealed, enclosed or isolated by either a selective growth process or by a non-conformal deposition technique. The air regions may be formed under any pressure, gas concentration or processing condition.

The techniques disclosed in the aforesaid patents rely on holes or other passageways for effecting removal of the sacrificial material. In U.S. Pat. No. 5,461,003, a sacrificial material is removed through a porous dielectric layer. According to this patent, metal leads are formed on a substrate, after which a disposable solid layer is deposited on the metal leads and substrate. The disposable solid layer is then etched back to expose the tops of the metal leads. Then a porous dielectric layer is deposited over the metal leads and disposable layer. This is followed by removal of the disposable layer which is said to be preferably accomplished by exposing the device to oxygen or oxygen-plasma at a high temperature (greater than 100 degrees Celsius) to vaporize, or burn off, the disposable layer. The oxygen moves through the porous dielectric layer to reach and react with the disposable layer and thereby convert it to a gas that moves back out of the porous dielectric layer. Upon removal of the disposable layer, air gaps are left. Finally, a non-porous dielectric layer is deposited on top of the porous dielectric layer to seal the porous dielectric layer from moisture, provide improved structural support and thermal conductivity, and passivate the porous dielectric layer. This procedure results in an air gap that does not extend the full height of the adjacent metal leads or lines. The '003 patent discloses a modified method to remedy this problem and to increase the process margin. This modified method involves a further process step wherein an oxide layer is formed on top of the metal leads so that the disposable dielectric layer can extend higher than the metal leads.

In U.S. Pat. No. 6,165,890 a sacrificial norbornene polymer is used between the metal lines of a semiconductor device and then the device is heated to decompose said polymer leaving an air gap between said metal lines. The decomposition products may be removed through holes or passages in the dielectric layer (col. 17, line 12), but preferably they are allowed to diffuse through a solid, porous, inorganic, permanent layer. One suitable dielectric layer comprises a silica-based xerogel containing from 10 to 90 percent porosity. In U.S. Pat. No. 6,451,712, a porous dielectric material is formed by decomposition of porogens contained in a thermoplastic matrix and permeation of the decomposition products of such pore forming materials through a hard mask.

Kohl, et al., IEEE Electron Device Letters, Vol. 21, No. 12, December 2000, p557–559 teach that critical material properties of a sacrificial polymer include: (a) a glass transition temperature sufficiently high to provide dimensional stability during processing (for example, greater than 350 degrees Celsius); (b) a sufficiently slow decomposition rate to mitigate problems of pressure build-up during air gap formation; (c) no objectionable residue after decomposition; and (d) a temperature of decomposition sufficiently low (for example, 450 degrees Celsius) to mitigate device damage that may occur at higher temperatures. Additional requirements for such decomposable sacrificial polymers are disclosed in IBM Technical Disclosure Bulletin, Vol. 38, No. 9 September 1995, p137–140.

According to the present invention there is provided a method of forming at least a partial air gap within a semiconducting device comprising the steps of: (a) depositing a sacrificial polymeric composition in one or more layers of the device during its formation; (b) coating the device with one or more layers of a relatively non-porous, organic, polymeric, insulating dielectric material (hardmask) having a density less than 2.2, preferably less than 2.0, more preferably less than 1.5, and most preferably less than 1.3 g/cm$^3$; and (c) decomposing the sacrificial polymeric composition such that the decomposition products permeate at least partially through the one or more hardmask layers, thereby forming at least a partial air gap within the device.

In addition, the present invention provides a semiconductor device, especially such a device prepared according to the foregoing method, comprising a substrate layer, one or more conductive layers, at least one layer of a relatively non-porous, organic polymeric insulating dielectric material (hardmask) having a density less than 2.2, preferably less than 2.0, more preferably less than 1.5, and most preferably less than 1.3 g/cm$^3$, and optionally an impermeable organic or inorganic sealing layer, wherein at least some portion of the conductive layer is separated from another portion thereof by at least a partial air gap.

The use of a hardmask composition in a coating layer over a sacrificial polymer layer would normally be expected to result in blistering or delamination as sacrificial polymer layer is decomposed unless chimneys or pores are introduced into the hardmask layer to assist in removal of volatile decomposition products of the sacrificial polymer. Surprisingly, the present inventors have discovered that such blistering or delamination can be avoided if an organic hardmask layer having a density less than 2.2, preferably less than 2.0, more preferably less than 1.5, and most preferably less than 1.3 g/cm$^3$ is employed.

In a separate embodiment of the invention, the permeability of the hardmask is further improved by subsequently introducing porosity therein, thereby further reducing the density of the hardmask layer. According to this embodiment of the invention, prior to or simultaneously with step (c), the one or more layers of an insulating dielectric material are treated so as to reduce the density and/or increase the permeability thereof to decomposition products of said sacrificial polymeric composition.

FIGS. 1–6 are diagrammatic cross-sections of a portion of a semiconductor structure, illustrating several steps of the present method.

For purposes of United States patent practice, the contents of any patent, patent application, provisional patent application, or publication referenced herein is hereby incorporated by reference in its entirety herein, especially with respect to its disclosure of monomer, oligomer, polymer, or semiconductor structures, synthetic or manufacturing techniques and general knowledge in the art. If appearing herein, the term "comprising" and derivatives thereof is not intended to exclude the presence of any additional component, step or procedure, whether or not the same is disclosed herein. In order to avoid any doubt, all compositions claimed herein through use of the term "comprising" may include any additional additive, adjuvant, or compound, unless stated to the contrary. In contrast, the term, "consisting essentially of" if appearing herein, excludes from the scope of any succeeding recitation any other component, step or procedure, excepting those that are not essential to operability. The term "consisting of", if used, excludes any component, step or procedure not specifically delineated or listed. The term "or", unless stated otherwise, refers to the listed members individually as well as in any combination.

The term "partially" or "at least partially" refers to the possibility that some portion of the sacrificial polymeric material or a degradation product residue thereof may remain in the semiconductor structure according to the present invention. Desirably at least 90 percent by weight, more preferably at least 99 percent by weight of the sacrificial polymer is lost and replaced by air or an inert gas in the resulting air gap. Additionally, at least 50 percent, more preferably at least 90 percent by weight of the decomposition products are removed by means of permeation through the hardmask layer or layers according to the invented process, any remainder exiting the structure between conductor layers or by voids or holes therein, or by other means.

By the term "relatively nonporous" is meant that the amount of pores in the hardmask are insufficient to permit escape of volatile decomposition products. Preferably 50 percent or less and more preferably at least 10 percent or less of such volatile decomposition products are removed from the resulting structure by means of voids or pores in direct communication with the outside of the structure.

By the term "decomposition" or "decomposition products" is meant products of lower molecular weight formed upon depolymerization or degradation of the sacrificial polymer or the composition comprising the sacrificial polymer layer. Such products may be formed by purely thermal depolymerization or degradation (volatilization) or through the action of a chemical agent such as oxygen, ozone, or fluorine.

Suitable sacrificial compositions for use in the present method include organic and inorganic polymeric materials that are subject to decomposition upon heating, optionally in the presence of a chemical agent. Examples of inorganic materials include solid inorganics, such as fluorinated amorphous carbon, as well as sulfide, oxide, carbide, and carbonate materials that are subject to thermal decomposition. Examples of organic materials include carbon, silicon or sulfur containing polymers containing at least some C—C bonds, that are similarly subject to thermal decomposition. Preferred sacrificial compositions are organic polymers, especially polyamides, polyacrylate-, polyvinylaromatic-, benzocyclobutene-, and polycycloolefmic-polymers.

Preferred sacrificial polymers include homopolymers and copolymers comprising polymerized reaction products of acrylate-, methacrylate-, vinylaromatic-, norbornene-, vinylbenzocyclobutene-, or ethynylaryl substituted 1,3-cyclopentadienone-monomers. Preferred copolymers include the foregoing monomers that are copolymerized with one or more polymerizable comonomers. Highly preferred polymers are the well known bisbiscycloolefins, especially homopolymers and copolymers based on norbornenes or substituted norbornenes.

Additional examples include copolymers of a first monomer selected from acrylates, vinylaromatics, norbornenes, and alkyldiol diacrylates with a second monomer selected from vinylbenzocyclobutenes or 1,3 bis 2[4-benzocyclobutenyl (ethenyl)]benzene. Highly desirably, the sacrificial polymer comprises a sufficient quantity of the first monomer, preferably from 99 to 40, more preferably from 95 to 75 mole percent, based on total monomer content of the polymer, and selected to give the polymer the desired decomposition temperature and a sufficient quantity of the second monomer, preferably from 1 to 60, more preferably from 5 to 25 mole percent, based on total monomer content of the polymer selected to give the polymer the desired glass transition temperature. Using this approach, it is possible to obtain a polymer having a decomposition and glass transition temperature tailored to the specific temperature requirements for processing air gap semiconductor structures.

Specific examples of suitable copolymers include copolymers of (a) 5-ethylidene-2-norbornene and vinylbenzocyclobutene (or a vinylbenzocyclobutene derivative); (b) 5-ethylidene-2-norbornene and 5-(3-benzocyclobutylidene)-

2-norbornene; (c) styrene (or a styrene derivative) and 5-3-benzocyclobutylidene)-2-norbornene; (d) styrene (or a derivative of styrene) and vinylbenzocyclobutene (or a vinylbenzocyclobutene derivative); and (e) bis[3-(4-benzocyclobutenyl)]1,n (n=2–12)alkyldiol diacrylate and 1,3 bis 2[4-benzocyclobutenyl (ethenyl)]benzene.

The term "derivative of styrene" used herein means Ar—CR=CH, wherein R is an alkyl group containing from 1–6 carbon atoms which may be mono or multisubstituted with functional groups such as nitro, amino, cyano, carbonyl and carboxyl and wherein Ar is phenyl, alkylphenyl, naphthyl, pyridinyl or anthracenyl.

The term "vinybenzocyclobutene" means bicyclo[4.2.0]octa-1,3,5-triene, 2-ethenyl and bicyclo[4.2.0]octa-1,3,5-triene, 3-ethenyl, i.e, the ethylene group is attached to the benzene ring and not the cyclobutene ring.

The term "derivative of vinylbenzocyclobutene" means that one or more of the hydrogens of vinylbenzocyclobutene are replaced with an alkyl, aryl, alkylaryl or hetero atom group(s) which may be mono or multisubstituted with functional groups such as nitro, amino, cyano, carbonyl and carboxyl.

The substrates used in this invention may be any substrate on which there is a desire to form a patterned, conductive layer. Typically, such substrate will include silicon wafers with or without lower level metal interconnect structures formed thereon.

Suitable sacrificial polymers for use herein include organic polymers (that is polymer comprising at least some carbon atoms and optionally heteroatoms such as oxygen or silicon in the backbone) or inorganic (that is lacking carbon atoms in the backbone, and preferably consisting of silicon, boron and other metal or metalloid atoms and, optionally oxygen atoms in the backbone). Examples of suitable organic polymers include polyvinylaromatic polymers such as polystyrene, poly-α-methylstyrene, copolymers of a vinylaromatic polymer and a comonomer; polyacrylonitriles, polyethylene oxides, polypropylene oxides, polyethylenes, polylactic acids, polysiloxanes, polycaprolactones, polyurethanes, polymethacrylates, polyacrylates, polybutadienes, polyisoprenes, polyamides, polytetrahydrofurans, polyvinyl chlorides, polyacetals, amine-capped alkylene oxides, polylactides, polylactates, polypropyleneoxides, and ethylene glycol/poly (caprolactones). Examples of inorganic polymers within the above definition are silica, siliconcarbide, and silsesquioxanes lacking carbon in the polymer matrix.

Preferred examples of organic polymers are polyarylenes, including polyarylene ethers (for example SiLK™ dielectric resins from The Dow Chemical Company, Flare™ resins from Honeywell), polyorganosiloxanes, and benzocyclobutene based resins (for example Cyclotene™ resins from The Dow Chemical Company). Additional suitable organic polymers useful as sacrificial polymers are the reaction product of monomers comprising cyclopentadienone functional groups and acetylene, preferably phenylacetylene, functional groups. Examples include polymers disclosed in U.S. Pat. No. 5,965,679, and in copending U.S. patent application Ser. No. 10/078205, filed Feb. 15, 2002.

A most preferred organic polymer for use as a sacrificial polymer is a copolymer of one or more vinylaromatic monomers, especially styrene, and one or more vinylbenzocyclobutene comonomers, containing from 50 to 90 mole percent, preferably from 60 to 80 mole percent polymerized vinylaromatic monomer. Such polymers are readily prepared by copolymerization of vinyl functionality of the separate monomers with resultant crosslinking occurring in the polymer due to residual ring opening of cyclobutene functionality at elevated processing temperatures during application and curing of the hardmask layer.

The sacrificial polymer may include one or more poragens which are occluded polymers of a different composition or form that are designed to readily decompose and leave a more porous structure with greater gas permeability within the sacrificial polymer layer. The porogen, or pore forming material can also enable the sacrificial polymer to decompose in stages without detrimental rapid gas evolution which can lead to blistering or delamination of the semiconductor layers or the hard mask itself.

Suitable poragen materials include linear, branched, star, hyperbranched, dendritic, and cross-linked oligomers or polymers. One preferred porogen morphology is cross-linked polymeric nanoparticles. The porogen, optionally, is chemically bonded to a matrix material, for example by inclusion of a reactive functionality which will bond to the matrix. Suitable chemistries for the porogen depend in part upon the matrix material selected. Preferably, the sacrificial polymer including any porogen decompose at temperatures in the range of about 250 to about 400° C. Suitable poragen polymers include polyvinylaromatic polymers such as polystyrene and poly-α-methylstyrene; polyacrylonitriles, polyethylene oxides, polypropylene oxides, polyethylenes, polylactic acids, polysiloxanes, polycaprolactones, polyurethanes, polymethacrylates, polyacrylates, polybutadienes, polyisoprenes, polyamides, polytetrahydrofurans, polyvinyl chlorides, polyacetals, amine-capped alkylene oxides, polylactides, polylactates, polypropyleneoxides, and ethylene glycol/poly (caprolactones).

The sacrificial polymers or polymeric composition is desirably readily dispersed or dissolved in common solvents, such as toluene, xylenes or mesitylene in order that the same may be coated onto a suitable substrate by typical coating techniques used in the industry, for example by spin coating, spraying, meniscus, extrusion- or other coating methods, or by pressing, laying or otherwise adhering a preformed film or laminated film onto the substrate.

Additional suitable sacrificial polymers for use herein include copolymers of α-methyl styrene and vinylbenzocyclobutene, disclosed in U.S. Pat. No. 4,698,394, and polymers taught in U.S. Pat. Nos. 5,461,003 and 6,165,890, and U.S. Ser. Nos. 10/445,650, 10/445,651, 10/445,652, all filed Feb. 5, 2003.

The insulating dielectric material (hardmask) may be formed from any suitable organic polymeric material (that is a polymer comprising at least some carbon atoms and optionally heteroatoms such as oxygen or silicon in the backbone) or such a material that is subject to later treatment so as to cause pore formation or to increase the permeability thereof to decomposition products of the sacrificial layer. A pore forming material (poragen) such as a decomposible substance or a blowing agent or a compound capable of generating a blowing agent may be included in the dielectric material and later activated or removed, either simultaneously with or prior to decomposition of the sacrificial material, thereby introducing pores or voids in the dielectric layer, if desired. In one embodiment, the method is similar to that of U.S. Pat. No. 5,461,003, excepting that the porosity of the dielectric layer is subsequently induced in the step required by the present invention either prior to or after an optional planarization step, by any suitable latent pore, void or cell generating technique, and the sacrificial layer is degraded by exposure to oxygen, an oxygen plasma, or other gaseous or liquid agent. Either an open cell or closed cell structure may be formed according to the present invention.

Suitable dielectric materials include polymeric organic substances such as hydrocarbon polymers, functionalized organic polymers, and mixed copolymers of carbon with silicon or boron. Preferred organic polymeric hardmask substances include polyarylene homopolymers and copolymers, as well as organic modified sesquisiloxanes, which are mixed, polymeric oxides of silicon and carbon, containing both silicon, oxygen and carbon atoms in the matrix. Mixtures of the foregoing polymeric materials with aluminum oxides, aluminum silicates, or mixed aluminum/magnesium silicates may also be employed. All of the foregoing organic polymers may be modified for reduction in density as disclosed herein, if desired.

Particularly preferred polymeric materials for use as dielectric or hardmask layers in the present invention comprise polyarylene resins, prepared by reacting polyfunctional compounds having two or more cyclopentadienone groups with polyfunctional compounds having two or more aromatic acetylene groups. Examples of such monomers as well as certain single component reactive monomers which contained one cyclopentadienone group together with two aromatic acetylene groups, specifically 3,4-bis(3-(phenylethynyl)phenyl)-2,5-dicyclopentadienone and 3,4-bis(4-(phenylethynyl)phenyl)-2,5-dicyclopentadienone, and polymers and insulative films made from such monomers were disclosed in U.S. Pat. No. 5,965,679. Typically, these materials are B-staged in solvent solution and then spin coated onto a substrate followed by a hotplate baking step and a subsequent curing (vitrification) to about 400–450° C. in an oven to complete the cure. Additional examples of suitable polyarylene dielectric materials are disclosed in U.S. Pat. Nos. 6,359,091, 6,172,128, 6,156,812, and WO00/31183.

Additional suitable materials include organosiloxanes, preferably the cured product formed from the hydrolyzed or partially hydrolyzed reaction products of substituted alkoxysilanes or substituted acyloxysilanes.

Hydrolysis of alkoxy or acyloxysilanes produces a mixture of nonhydrolyzed, partially hydrolyzed, fully hydrolyzed and oligomerized alkoxy silanes or acyloxysilanes. Oligomerization occurs when a hydrolyzed or partially hydrolyzed alkoxysilane or acyloxysilane reacts with another alkoxysilane or acyloxysilane to produce water, alcohol or acid and a Si—O—Si bond. As used herein, the term "hydrolyzed alkoxysilane" or "hydrolyzed acyloxysilane" encompasses any level of hydrolysis, partial or full, as well as oligomerized. The substituted alkoxy or acyloxy silane prior to hydrolysis is preferably of the formula:

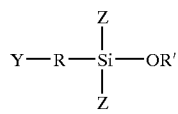

wherein R is $C_1$–$C_6$ alkylidene, $C_1$–$C_6$ alkylene, arylene, or a direct bond; Y is $C_1$–$C_6$ alkyl, $C_2$–$C_6$ alkenyl, a $C_{2-6}$ alkynyl, a $C_6$–$C_{20}$ aryl, 3-methacryloxy, 3-acryloxy, 3-aminoethyl-amino, 3-amino, —$SiZ_2OR'$, or —$OR'$; $R'$ is independently, in each occurrence, a $C_1$–$C_6$ alkyl or $C_2$–$C_6$ acyl; and Z is $C_1$–$C_6$ alkyl, $C_2$–$C_6$ alkenyl, $C_{2-6}$ alkynyl, $C_{6-20}$ aryl, or —$OR'$. The term "alkylidene" refers to aliphatic hydrocarbon radicals wherein attachment occurs on the same carbon. The term "alkylene" refers to radicals, which correspond to the formula —$(C_nH_{2n})$—. The term "aryl" refers to an aromatic radical, "aromatic" being defined as containing (4n+2) electrons, as described in Morrison and Boyd, *Organic Chemistry*, 3rd Ed., 1973. The term "arylene" refers to an aryl radical having two points of attachment. The term "alkyl" refers to saturated aliphatic groups, such as methyl, ethyl, etc. "Alkenyl" refers to alkyl groups containing at least one double bond, such as ethylene, butylene, etc. "Alkynyl" refers to alkyl groups containing at least one carbon to carbon triple bond. "Acyl" refers to a group having —C(O)R structure (for example, a $C_2$ acyl would be —$C(O)CH_3$). "Acyloxy" refers to groups having —OC(O)R structure. The groups previously described may also contain other substituents, such as halogens, alkyl groups, aryl groups, and hetero groups, such as ethers, oximino, esters, amides; or acidic or basic moieties, that is, carboxylic, epoxy, amino, sulfonic, or mercapto, provided the alkoxysilane remains compatible with the other components of the coating composition. Preferably, the silanes used are mixtures of silanes. The silanes may be alkoxy silane, acyloxy silane, trialkoxysilanes, triacyloxysilanes, dialkoxysilanes, diacyloxysilanes, tetraalkyoxysilane or tetra-acyloxysilanes. Examples of some of the organic groups directly attached to the silicon atom may be such things as phenyl, methyl, ethyl, ethacryloxypropyl, aminopropyl, 3-aminoethylaminopropyl, vinyl, benzyl, bicycloheptenyl, cyclohexenylethyl, cyclohexyl, cyclopentadienylpropyl, 7-octa-1-enyl, phenethyl allyl or acetoxy. The silanes are preferably hydrolyzed or partially hydrolyzed by a solventless process. The silanes will retain organic portions even after cure, provided some organic groups are bonded directly to the silicon atom. In order to balance desired properties in the hardmask layer, a mixture of silanes may be used. For example, applicants have found that use of an aryl alkoxy or aryl acyloxy silane (such as, phenyltrimethoxy silane) in combination with an alkyloxysilane or acyloxysilane having a group with unsaturated carbon-carbon bonds (for example alkenyl or alkyidenyl moieties such as vinyl or phenyethynyl) provides excellent wetting, coating and adhesion properties with sacrificial polymeric materials, and ultimately with the conductive layers to which they adhere. The presence of the aromatic substituted silane also improves moisture sensitivity and may improve dielectric constant over single silane systems. Furthermore, using alkylalkoxy silanes or alkyl acyloxy silanes (such as methyltrimethoxysilane or ethyltrimethoxysilane) in combination with the aryl and unsaturated substituted silanes has been found to further improve moisture retention/exclusion and reduce dielectric constant in the resulting hardmask. Furthermore, a mixture of monoalkoxy, monoacyloxy, dialkoxy, diacyloxy, trialkoxy, triacyloxy, tetraalkoxy silanes or tetraacyloxy silanes may be used in the mixtures as well to enable enhancement of etch selectivity, adjustment of branching, etc.

Particularly, preferred is the following composition which is the hydrolzyed or partially hydrolyzed product of a mixture comprising (a) 50–95 mole percent silanes of the formula:

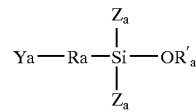

wherein Ra is $C_1$–$C_6$ alkylidene, $C_1$–$C_6$ alkylene, arylene, or a direct bond; Ya is $C_{1-6}$ alkyl, $C_2$–$C_6$ alkenyl, $C_{2-6}$ alkynyl, $C_6$–$C_{20}$ aryl, 3-methacryloxy, 3-acryloxy, 3-aminoethyl-amino, 3-amino, —$SiZa_2ORa'$, or —$ORa'$; $Ra'$ is independently, in each occurrence, a $C_1$–$C_6$ alkyl or $C_2$–$C_6$ acyl; and Za is $C_1$–$C_6$ alkyl, $C_2$–$C_6$ alkenyl, $C_{2-6}$ alkynyl, $C_{6-20}$ aryl, or —ORa', provided at least one of Za or the combination Ra-Ya comprises a non-aromatic carbon carbon bond unsaturation, (b) 5 to 40 mole percent silanes of the formula:

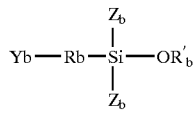

wherein Rb is $C_1$–$C_6$ alkylidene, $C_1$–$C_6$ alkylene, arylene, or a direct bond; Yb is $C_1$–$C_6$ alkyl, $C_2$–$C_6$ alkenyl, $C_{2-6}$ alkynyl, $C_6$–$C_{20}$ aryl, 3-methacryloxy, 3-acryloxy, 3-aminoethyl-amino, 3-amino, —SiZb$_2$ORb', or —ORb'; Rb' is independently, in each occurrence, a $C_1$–$C_6$ alkyl or $C_2$–$C_6$ acyl; and Zb is $C_1$–$C_6$ alkyl, $C_2$–$C_6$ alkenyl, $C_{2-6}$ alkynyl, $C_{6-20}$ aryl, or —ORb', provided at least one of Zb or the combination of Rb—Yb comprises an aromatic ring, and (c) 0 to 45 mole percent of silanes of the formula:

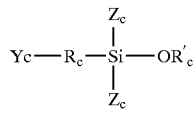

wherein Rc is $C_1$–$C_6$ alkylidene, $C_1$–$C_6$ alkylene, arylene, or a direct bond; Yc is $C_1$–$C_6$ alkyl, $C_2$–$C_6$ alkenyl, $C_{2-6}$ alkynyl, $C_6$–$C_{20}$ aryl, 3-methacryloxy, 3-acryloxy, 3-aminoethyl-amino, 3-amino, —SiZc$_2$ORc', or —ORc'; Rc' is independently, in each occurrence, a $C_1$–$C_6$ alkyl or $C_2$–$C_6$ acyl; and Zc is $C_1$–$C_6$ alkyl, $C_2$–$C_6$ alkenyl, $C_{2-6}$ alkynyl, $C_{6-20}$ aryl, or —ORc', provided at least one of Zc or the combination of Rc-Yc comprises an alkenyl. The foregoing mole percentages are based on total moles of silanes (a), (b) and (c) in the hardmask composition.

According to one embodiment of the invention, the material forming the hardmask layer may contain a small portion of a pore forming substance which decomposes after formation of the layer, thereby reducing the density of the dielectric material or increasing the permeability thereof to decomposition products of the sacrificial polymer layer. Suitable pore forming substances (poragens) include carbon particles, carbon fibers (including carbon nanotubes), crosslinked polymers, block copolymers, and bulky dendridic type polymers. Desirably, the poragen is present in the dielectric material in an amount from 1 to 50, preferably from 5 to 25 percent, based on total hardmask material weight.

Suitable poragens for use in the hardmask include any compound that can form small domains in a matrix formed from the precursors and which can be subsequently removed, for example by thermal decomposition. Preferred poragens are polymers including homopolymers and interpolymers of two or more monomers including graft copolymers, emulsion polymers, and block copolymers. Suitable thermoplastic materials include polystyrenes, polyacrylates, polymethacrylates, polybutadienes, polyisoprenes, polyphenylene oxides, polypropylene oxides, polyethylene oxides, poly(dimethylsiloxanes), polytetrahydrofurans, polyethylenes, polycyclohexylethylenes, polyethyloxazolines, polyvinylpyridines, polycaprolactones, polylactic acids, copolymers of the monomers used to make these materials, and mixtures of these materials. The thermoplastic materials may be linear, branched, hyperbranched, dendritic, or star like in nature. The poragen may also be designed to react with the cross-linkable matrix precursor during or subsequent to B-staging to form blocks or pendant substitution of the polymer chain. For example, thermoplastic polymers containing reactive groups such as vinyl, acrylate, mettacrylate, allyl, vinyl ether, maleimido, styryl, acetylene, nitrile, furan, cyclopentadienone, perfluoroethylene, BCB, pyrone, propiolate, or ortho-diacetylene groups can form chemical bonds with the cross-linkable matrix precursor, and then the thermoplastic can be removed to leave pores. The poragen added to the hardmask material is desirably a material that results in formation of voids or pores in the matrix having an average pore diameter from 1 to 200 nm, more preferably from about 2 to 100 nm, most preferably from about 5 to 50 nm. Suitable block copolymers include those wherein one of the blocks is compatible with cross-linked polymer matrix resin and the other block is incompatible therewith. Useful polymer blocks can include polystyrenes such as polystyrene and poly-α-methylstyrene, polyacrylonitriles, polyethylene oxides, polypropylene oxides, polyethylenes, polylactic acids, polysiloxanes, polycaprolactones, polyurethanes, polymethacrylates, polyacrylates, polybutadienes, polyisoprenes, polyvinyl chlorides, and polyacetals, and amine-capped alkylene oxides (commercially available as Jeffamine™ polyether amines from Huntsman Corp.).

Preferably, the poragens employed in the hardmask composition are grafted to a B-stageable precursor. This may be accomplished by adding the porogens to monomers prior to B-staging as residual ethylenically unsaturated groups on the porogen are available to react with reactive groups on the monomers. Alternatively, some B-staging may occur prior to addition of the porogen and the porogen may be grafted by subjecting the mixture to conditions sufficient to cause residual ethylenically unsaturated groups on the porogen to react with residual react groups in the B-staged reaction product. The mixture is then coated onto a substrate (preferably solvent coated as for example by spin coating by known methods). The matrix is cured and the porogen is removed by heating it past its thermal decomposition temperature.

Highly preferred poragens are crosslinked polymers made by an emulsion polymerization. Emulsion polymerization techniques are known in the art, and elaborated, for example, in numerous literature sources. Very small crosslinked hydrocarbon based polymer particles have been prepared in an aqueous emulsion polymerization by use of one or more anionic-, cationic-, or non-ionic surfactants. Examples of such preparations may be found in J. Dispersion Sci. and Tech., vol. 22, No. 2–3, 231–244 (2001), *The Applications of Synthetic Resin Emulsions*, H. Warson, Ernest Benn Ltd., 1972, p.88, and Colloid Polym. Sci., 269, 1171–1183 (1991), Polymer Bull., 43, 417–424 (1999), and U.S. Ser. No. 10/077642, filed Feb. 15, 2002 among other sources.

In another embodiment of the invention, the hardmask layer includes a cell forming substance, such as a blowing agent, an azide, a volatile organic or inorganic forming substance, or a polymer that is subject to swelling and subsequent shrinkage, thereby creating a void space within a matrix of the dielectric material. In this manner, porosity is created in the dielectric material, the density is reduced, or the permeability of the dielectric material to the decomposition products of the sacrificial layer is increased.

Suitable solvents for use in preparing formulations of the hardmask layers herein include known solvents useful in processing thermoset polyarylene precursor compositions. The solvent may be a single solvent or a mixture of one or more solvents. Examples include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

Figure 2:
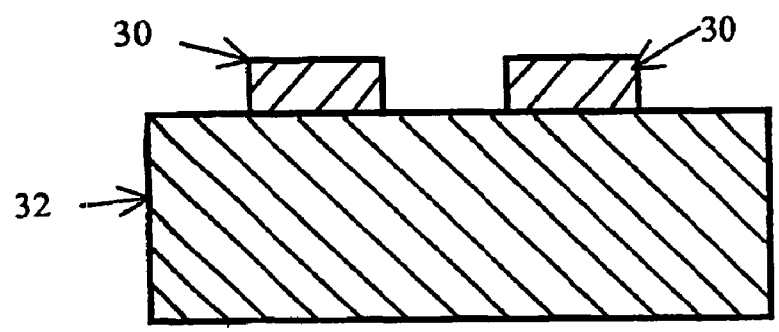

Referring now to FIGS. 1–6, wherein is shown diagrammatic cross-sections of a portion of a semiconductor structure, illustrating several steps of a method according to one aspect of the instant invention. In FIGS. 1 and 2 a patterned layer of a sacrificial polymer 30 is formed on a substrate 32. The substrate 32 may be patterned or unpatterned. The substrate may be a base layer or a layer of material overlaying a base layer such as an insulating layer of silicon dioxide that may overlie the devices on an integrated circuit chip (not shown). By way of specific example, the substrate may be a semiconductor wafer that may, for example, contain transistors, diodes, and other semiconductor elements (as are well known in the art).

As depicted in FIG. 1, the sacrificial layer 30 is deposited on the substrate 32, in a relatively uniform thin layer, by spin coating, spray coating or meniscus coating, chemical vapor deposition, plasma enhanced chemical vapor deposition, sol-gel process, or other suitable method, most preferably by spin coating a solution thereof and removing the solvent.

In FIG. 2, the sacrificial layer is patterned to correspond to the desired pattern of one or more air gaps to be formed in the semiconductor device. Any suitable technique can be used to pattern the sacrificial layer, including, for example, laser ablating, etching, etc. The sacrificial layer may also be made photosensitive to facilitate patterning.

Figure 3:
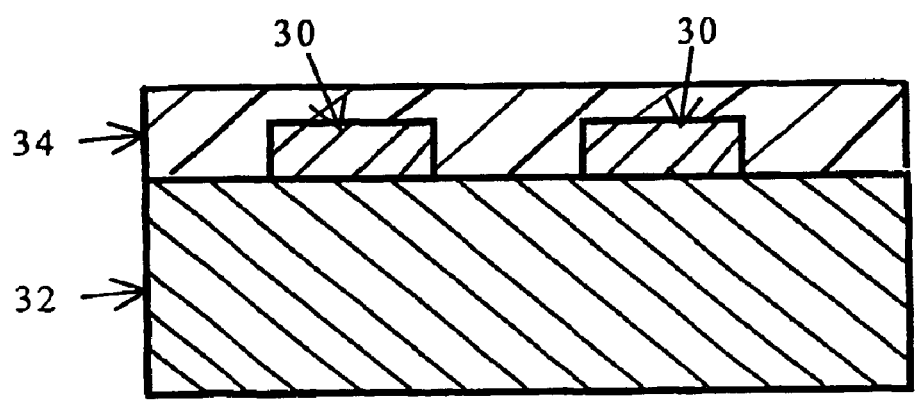

In FIG. 3, a layer of conductive material 34, usually a metal such as copper or aluminum is deposited in the ablated areas of sacrificial layer 30 and over remaining portions thereof. This may be done by any suitable technique including, for example, metal sputtering, chemical vapor deposition (CVD), physical vapor deposition (PVD), electroplating, electroless plating, etc.

Figure 4:
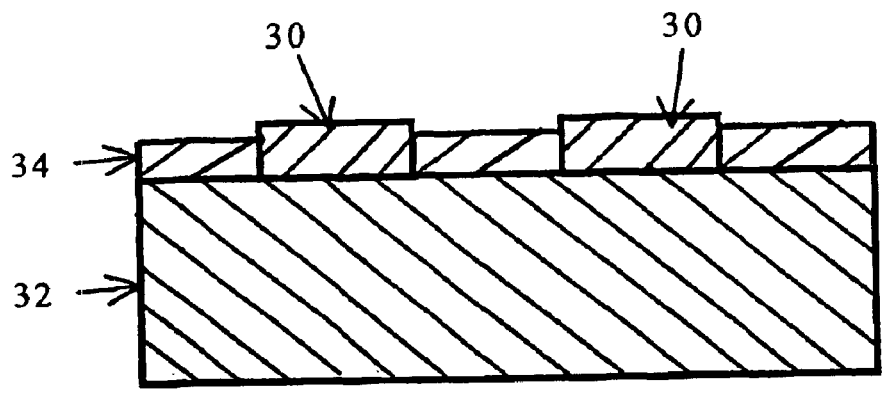

In FIG. 4, the conductive layer 34 is planarized if needed by any suitable technique including, for example, chemical mechanical polishing (CMP). If CMP is used, an etch stop (such as a layer of silicon dioxide or other suitable material) may be applied to the surface of the sacrificial layer. The skilled artisan will realize that the order of forming the various layers can of course be reversed with a patterned conductive layer 34 being first formed on a substrate by any suitable technique, and the sacrificial layer 30 subsequently formed thereafter and the surface planarized to expose separate surfaces of conductive layer 34 and sacrificial polymer layer 30. Moreover, the foregoing process may be repeated one or more times to create a multiple level semiconductor device according to the invention.

As seen in FIG. 4, the conductive layer 34 can be conveniently formed with a height less than the height of the adjacent sacrificial material. As will be appreciated, this will result in air gaps that extend above the tops of the metal leads, as is desirable to reduce capacitive coupling. The skilled artisan will also appreciate that the substrate 32 could be selectively ablated or removed in a pattern corresponding to the pattern of the sacrificial material (not depicted), so that the resultant air gaps will extend below the level of the substrate upon which the conductive layer is deposited.

Figure 5:
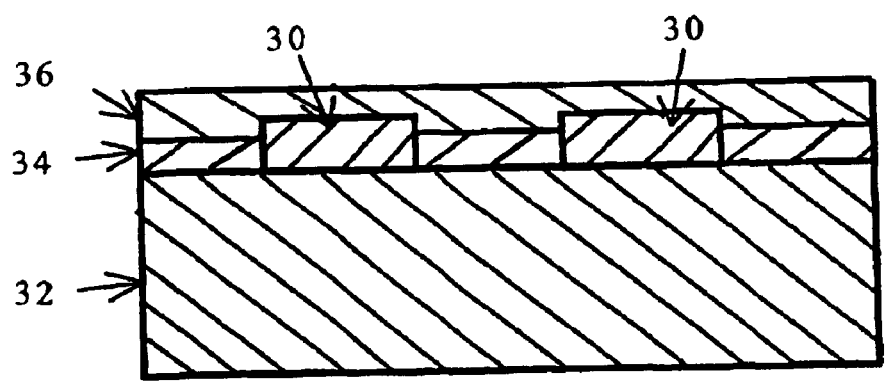

In FIG. 5, a permanent dielectric or hardmask 36 according to the invention is deposited over the surface of sacrificial layer 30 and conductive layer 34. The permanent dielectric 36 is deposited as a solid layer and covers the sacrificial layer 30 and at least the exposed surfaces of the conductive layer 34. If desired, an oxide coating may be applied to the exposed outer surface of the conductive layer 34 or the surface reduced to a height less than that of the adjacent sacrificial layer to eliminate or decrease fringe effect. The permanent dielectric layer may be planarized before or after removal of the sacrificial material, if desired, as well. The permanent dielectric layer may be deposited by spin coating, spray coating or meniscus coating, chemical vapor deposition, plasma enhanced chemical vapor deposition, sol-gel process, or other method.

Figure 6:
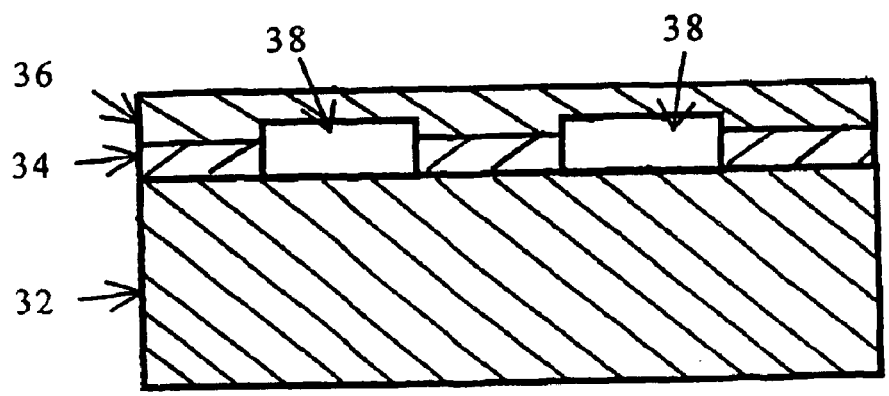

The material comprising the sacrificial layer 30 is removed through the permanent dielectric layer 36 to form the air gaps 38 shown in FIG. 6. The removal of the sacrificial layer preferably is accomplished by thermal decomposition and passage of one or more of the decomposition products through the permanent dielectric layer 36 by diffusion. Desirably, the molecular weights of the degradation products from the sacrificial layer are relatively low, thereby facilitating their removal from the semiconductor structure. Highly desirably, the compounds used as a sacrificial layer undergo thermal decomposition at temperatures from 300 to 500° C., preferably from 350 to 450° C., most preferably from 400 to 425° C., with essentially no residue (that is, less than 5 weight percent residue) being left in the air gaps of the resultant semiconductor structure 40.

The rate of decomposition of the sacrificial layer should be slow enough so that diffusion through the permanent dielectric will occur without physical distortion of the permanent dielectric layer. Diffusion typically arises from a pressure build-up within the air gap. This pressure build-up should not be so great as to exceed the mechanical strength of the permanent dielectric. Increased temperature will generally aid diffusion as diffusivity of gas through the permanent dielectric will normally increase with temperature.

As will be appreciated, the air gaps may contain residual gas from the decomposition although generally such residual gas will eventually exchange with air. Steps may be taken to prevent such exchange, or to dispose a different gas (a noble gas for example) and/or a partial vacuum in the air gaps. For example, the semiconductor structure may be subjected to vacuum conditions to extract any residual gas from the air gaps by diffusion or otherwise after which the semiconductor structure may be coated by a suitable sealing material. Before the semiconductor structure is sealed, it may be subjected to a controlled gas atmosphere, such as one containing a noble gas, to fill the air gaps with such gas. Further processing steps may be performed on the semiconductor structure 40, for example to form additional layer(s) of interconnection in the semiconductor device having air gaps above and below conductor lines as well as air gaps on the sides of conductor lines. Thus, the sacrificial layer of the instant invention may be decomposed as a single layer before each next interconnect level or multiple layers of sacrificial material may be simultaneously decomposed after multiple interconnect levels have been built. Preferably, the entire multiple layer interconnect structure is built and the layers decomposed simultaneously. Those skilled in the art will also appreciate that many techniques may be employed to remove or decompose the sacrificial layer. However, thermal decomposition is the preferred technique.

If desired one or more impermeable coating or encapsulating layers (sealing layers) (not depicted) may be applied over the hardmask to prevent further gas exchange with the semiconductor structure. The method of the instant invention is not limited to the specific steps outlined above with reference to FIGS. 1–6. For example, U.S. Pat. Nos. 6,165,890 and 5,965,679, and numerous other references disclose other suitable techniques and structures.

The following examples are for illustrative purposes only and are not intended to limit the scope of this invention. Densities are measured by Rutherford Back Scattering (RBS).

EXAMPLE 1

A) Sacrificial Polymer-α-methyl styrene/vinylbenzocyclobutene copolymer

A one liter round bottom flask is equipped with a magnetic stirring bar, a thermometer, a gas inlet adapter and a septum. The flask is heated to 110 degrees Celsius and dried with a stream of dry nitrogen. The flask is then cooled in an ice/water bath. 400 milliliters of dry cyclohexane and 38 milliliters of dry tetrahydrofuran are added to the flask. 82.6 grams of alpha methyl styrene (passed over alumina to remove inhibitor and then distilled from calcium hydride) is added to the flask by cannula. 39 grams of vinylbenzocyclobutene (purified by distillation from calcium hydride, treated with butyl lithium to a persistent color and then distilled again) is added to the flask by syringe.

The temperature of the flask is brought to 8 degrees Celsius. 4.6 milliliters of 0.725 molar sec butyl lithium solution in cyclohexane is added to the flask with stirring to initiate polymerization. The temperature of the flask rises to 12 degrees Celsius. The flask is stirred for two hours. 2 milliliters of isopropanol is then added to the flask. The polymer produced in the flask is precipitated by adding more isopropanol, dried, dissolved in methylene chloride, precipitated in methanol and then dried.

The dried polymer weighs 82 grams. Proton NMR analysis indicates that the dried polymer is a copolymer of alpha methyl styrene and vinylbenzocyclobutene. Proton NMR analysis also indicates that the dried polymer is 29.7 weight percent vinylbenzocyclobutene. Gel Permeation Chromatography analysis indicates that the number average molecular weight of the dried polymer is 16,300 grams per mole compared to polystyrene standards with a polydispersity of 1.11. Differential Scanning Calorimiety shows a glass transition temperature of 200 degrees Celsius prior to benzocyclobutene cure, then a glass transition temperature of 350 degrees Celsius after curing at 280 degrees Celsius (the cyclobutene group on the polymer opens at 280 degrees Celsius and cross-links the polymer by way of reaction with a neighboring cyclobutene group, see Kirchhoff et al., Prog. Polym. Sci. Vol 18, 85–185, 1993, the cyclobutene rings on the benzocyclobutene moieties begin to undergo ring opening at a significant rate at 200 degrees Celsius with a polymerization exotherm maximum temperature at 250–280 degrees Celsius). Six grams of the dried polymer (uncured) is dissolved in fourteen grams of mesitylene and filtered with a one micron pore size filter. Two milliliters of the filtered polymer solution is spin coated (3,500 rpm) on a semiconductor substrate to produce a sacrificial layer of a semiconductor device.

B) Dielectric Polymer Formation a) (4-(3,5-bis(Phenylethynyl)phenyl)2,3,5-triphenylcyclopentadienone)

Synthesis of 1-Phenylethynyl-3,5-Dibromobenzene 1,3,5-Tribromobenzene (31.48 grams, 0.10 mole); phenylacetylene (10.22 grams, 0.10 mole); anhydrous, nitrogen sparged triethylamine (48.18 grams, 0.476 mole); triphenylphosphine (0.66 gram, 0.00253 mole); palladium (II) acetate (0.09 gram, 0.00041 mole) and anhydrous, nitrogen sparged N,N-dimethylformamide (90 milliliters) were added under a dry nitrogen atmosphere to a predried 500 milliliter glass three neck round bottom reactor containing a predried magnetic stirring bar. The reactor was additionally outfitted with a fan cooled spiral condenser and a thermometer with thermostatically controlled heating mantle. Stirring and heating commenced, and after 14 minutes, when a temperature of 35° C. was achieved, a clear, light amber colored solution formed. After a cumulative 1.6 hours reaction time, a temperature of 80° C. was achieved and maintained for the next 17.2 hours. At this time, high pressure liquid chromatographic (HPLC) analysis indicated that full conversion of the phenylacetylene reactant had been achieved. The reactor contents were poured over cracked ice contained in a 2 liter beaker. After complete melting of the ice, the precipitated product was recovered via filtration through a medium fritted glass funnel. The product cake on the funnel was washed with two portions (100 milliliter) of deionized water, then directly recrystallized, as a damp product, from boiling ethanol (350 milliliters total volume at boiling). The recrystallization solution was allowed to cool to room temperature and held there for 16 hours to provide 17.1 grams of a light yellow fibrous crystalline product after recovery via filtration and drying under vacuum (40° C. and 1 mm Hg). HPLC analysis revealed the presence of the desired 1-phenylethynyl-3,5-dibromobenzene product at 89 area percent, residual 1,3,5-tribromobenzene at 4 area percent and the 7 area perccent balance as a single unknown. The spectrum as determined by $^1$H nuclear magnetic resonance (NMR) analysis was consistent with the desired product.

Synthesis of 3,5-Dibromobenzil

A portion of the product containing 1-phenylethynyl-3,5-dibromobenzene (6.94 grams) and dimethylsulfoxide (100 milliliters) were added to a 500 milliliter glass three neck round bottom reactor outfitted with a chilled (2° C.) condenser, a thermometer with thermostatically controlled heating mantle, and a magnetic stirring bar. The reactor contents were heated as a stirred solution to 140° C., then iodine (0.07 gram, 0.00055 mole) was added. After 3 days at the 140° C. reaction temperature, the hot product solution was cooled to 25° C., resulting in the formation of a yellow crystalline slurry. The slurry was added to a beaker containing a stirred mixture of 10 percent aqueous sodium hydrosulfite (87 milliliters), deionized water (100 milliliters) and diethyl ether (200 milliliters). After stirring for one hour, the diethyl ether layer was recovered in a separatory funnel, then washed with three portions (75 milliliter) of deionized water. The recovered diethyl ether solution was dried over anhydrous sodium sulfate and filtered through a medium fritted glass funnel to provide a filtrate which was then rotary evaporated to dryness. The crude product was recrystallized from boiling ethanol. The recrystallization solution was allowed to cool to room temperature and held therein for 16 hours to provide 5.70 grams of a light yellow fluffy crystalline product. HPLC analysis revealed the presence of the desired 3,5-dibromobenzil product at 99 area percent with the 1 area percent balance as a single unknown. The $^1$H NMR spectrum corresponded to that of the desired product.

Synthesis of 3,5-bis(Phenylethynyl)benzil 3,5-Dibromobenzil (12.50 grams, 0.0679 bromine equivalent); phenylacetylene (8.40 grams, 0.0822 mole); anhydrous, nitrogen sparged triethylamine (18.77 grams, 0.186 mole); triphenylphosphine (0.45 gram, 0.0017 mole); palladium (II) acetate (0.06 gram, 0.00028 mole) and anhydrous, nitrogen sparged N,N-dimethylformnamide (79 milliliters) were added under a dry nitrogen atmosphere to a predried 500 milliliter glass three neck round bottom reactor containing a predried magnetic stirring bar. The reactor was additionally outfitted with a fan cooled spiral condenser and a thermometer with a thermostatically controlled heating mantle. Stirring and heating of the light amber colored solution was commenced and after 13 minutes, a temperature of 80° C. was achieved and maintained for the next 15.1 hours. At this time, HPLC analysis indicated that full conversion of the 3,5-dibromobenzil reactant had been achieved. The reactor contents were poured over cracked ice contained in a 2 liter beaker. After complete melting of the ice, the precipitated product was recovered via filtration through a medium fritted glass funnel. The product cake on the funnel was washed with two portions (100 milliliter) of deionized water, then directly recrystallized, as a damp product, from boiling acetone (160 milliliters total volume at boiling). The recrystallization solution was allowed to cool to room temperature and held therein for 16 hours to provide 10.90 grams (78.2 percent isolated yield) of a yellow fibrous crystalline product after recovery via filtration and drying under vacuum (40° C. and 1 mm Hg). HPLC analysis revealed the presence of the desired 3,5-bis(phenylethynyl) benzil product at 100 area percent. The $^1$H NMR spectrum was consistent with the desired product. The product identity was confirmed by electron ionization mass spectroscopic analysis (EI MS).

Synthesis of 4-(3,5-bis(Phenylethynyl)phenyl)-2,3,5-triphenylcyclopentadienone

A portion of the 3,5-bis(phenylethynyl)benzil (10.87 grams, 0.0265 mole), 1,3-diphenylacetone (5.90 grams, 0.0281 mole), anhydrous 1-propanol (300 milliliters) and anhydrous toluene (17 milliliters), both of which had been sparged with dry nitrogen, were added under a dry nitrogen atmosphere to a predried 500 milliliter glass three neck round bottom reactor containing a predried magnetic stirring bar. The reactor was additionally outfitted with a fan cooled spiral condenser and a thermometer with thermostatically controlled heating mantle. Stirring and heating commenced, and once a refluxing clear light yellow colored solution formed, benzyltrimethylammonium hydroxide (40 percent in methanol) (0.91 gram) was added, immediately inducing a dark red color. After maintaining the reflux for 20 minutes, HPLC analysis indicated that full conversion of the 3,5-bis [phenylethynyl)benzil reactant had been achieved. After a cumulative 30 minutes of reaction, the heating mantle was removed from the reactor, and the stirred contents were maintained at 24° C. for the next 16 hours. The product was recovered via filtration through a medium flitted glass funnel. The product cake on the funnel was washed with two portions (50 milliliters) of 1-propanol, then dried in a vacuum oven to provide 11.84 grams (76.4 percent isolated yield) of 4-(3,5-bis(phenylethynyl)phenyl)-2,3,5-triphenylcyclopentadienone (unsymmetrically substituted 3,5-AAB monomer) as a dark red purple colored crystalline product. HPLC analysis revealed the presence of the desired product at 100 area percent. The product's identity was confirmed by $^1$H NMR and EI MS analysis.

Spin Coating Dielectric (Hardmask) Material

Spin coating compositions of 4-(3,5-bis(Phenylethynyl) phenyl)-2,3,5-triphenylcyclopentadienone with and with out crosslinked styrene/divinylbenzene microemulsion polymerized particles at 20 percent loading level and γ-butyrolactone diluent were B-staged by heating to 200° C. for 48 hours. The pore forming materials were prepared by the technique of microemulsion polymerization at 30° C., using high purity deionized water; a nonylphenol ethoxylate surfactant such as Tergitol™ NP-15, available from The Dow Chemical Company; a 90/10 (w/w) styrene/divinylbenzene monomer mix; and a free radical initiator comprising t-butylhydroperoxide and ascorbic acid to give very small, <50 nm Dv, poragen particles. The resultant solutions were diluted with cyclohexanone to give 20 percent solids solutions. These solutions may then be used to prepare spun coated, cured dielectric coatings having densities of 1.05 g/cm$^3$. In the case of the poragen containing hardmask material, the poragen was removed by thermal degradation to further reduce the density of the coating to 0.9 g/cm$^3$.

By combining the foregoing sacrificial polymer layers and dielectric polymer layers on a semiconductor substrate to produce a system like that shown in FIG. 1 which is then processed as shown in FIGS. 2–6, a semiconductor device having air gaps is produced.

EXAMPLE 2

A 5 percent mesitylene solution of a styrene/vinylbenzocyclobutene copolymer containing 70 mole percent polymerized styrene and 30 mole percent polymerized vinylbenzocyclobutene is prepared for use as the sacrificial polymer.

A cross-linkable organosiloxane composition for use as an oligomeric precursor for the hardmask is prepared by hydrolysis and subsequent copolymerization of vinyl triacetoxysilane and phenyl trimethoxysilane monomers as described in WO 02/16477.

A multilayer electronic device is prepared in the following manner:

1) The sacrificial polymer solution described above is dispensed onto an electronic substrate at 60 rpm, spun at 3000 rpm for 30 seconds and baked at 250° C. for 20 minutes under nitrogen.

2) The sacrificial polymer coating is patterned using standard lithographic and etching methods to form an interconnection pattern. Conductive metal is deposited into the interconnection pattern. The surface of the wafer is polished via chemical/mechanical polishing to remove deposited metal overburden and provide a level surface of exposed conductors and sacrificial polymer.

3) The cross-linkable organosiloxane solution described above is diluted to 4 percent solids in propylene glycol methylether acetate (Dowanol™ PMA, available from The Dow Chemical Company). This solution is applied at 600 rpm to the surface of the wafer, spun at 3000 rpm for 30 seconds, and baked 265° C. for 60 seconds; thus creating a hardmask dielectric layer having a density of 1.3 g/cm$^3$.

4) The sample multilayer wafer is placed in an oven under nitrogen at room temperature, ramped to 430° C. over one hour, and held at 430° C. for 40 minutes. After cooling to room temperature, the hardmask layer is found to be free of defects by optical inspection. Microscopic examination reveals that the sacrificial polymer is removed by degradation and subsequent permeation through the hardmask, without detrimental effect on the hardmask layer.

The above process steps, or at least steps 1)–3), may be repeated for additional layers of interconnect, optionally with deposition of an interposed layer of a dielectric or substrate material. The removal of the sacrificial polymer layer or layers, described in step 4, may be conducted after each repeat of step 3) or once after multiple interconnected layers of the semiconductor device have been formed.

What is claimed is:

1. A method of forming at least a partial air gap within a semiconducting device comprising the steps of: (a) depositing a sacrificial polymeric composition in one or more layers of the device during its formation; (b) coating the device with one or more layers of a relatively non-porous, organic, polymeric, insulating dielectric material (hardmask) having a density less than 2.2 g/cm$^3$; and (c) decomposing the sacrificial polymeric composition such that the decomposition products permeate at least partially through the one or more hardmask layers, thereby forming at least a partial air gap within the device.

2. The method of claim 1, wherein the sacrificial polymer is a copolymer of a first monomer selected from the group consisting of acrylates, vinylaromatics, norbornenes, and alkyldiol diacrylates with a second monomer selected from the group consisting of vinylbenzocyclobutenes and 1,3 bis 2[4-benzocyclobutenyl(ethenyl)]benzene.

3. The method of claim 1, wherein the sacrificial polymer is a copolymer of (a) 5-ethylidene-2-norbornene and vinylbenzocyclobutene (or a vinylbenzocyclobutene derivative); (b) 5-ethylidene-2-norbornene and 5-(3-benzocyclobutylidene)-2-norbornene; (c) styrene (or a styrene derivative) and 5-(3-benzocyclobutylidene)-2-norbornene; (d) styrene (or a derivative of styrene) and vinylbenzocyclobutene (or a vinylbenzocyclobutene derivative); or (e) bis[3-(4-benzocyclobutenyl)]1,n (n=2–12)alkyldiol diacrylate and 1,3 bis 2[4-benzocyclobutenyl(ethenyl)]benzene.

4. The method of claim 1, wherein the sacrificial polymer is a copolymer comprising from 99 to 40 mole percent styrene or a styrene derivative and from 1 to 60 mole percent vinylbenzocyclobutene or a vinylbenzocyclobutene derivative based on total moles of incorporated monomers in the polymer.

5. The method of claim 1, wherein the sacrificial polymer is a copolymer of α-methylstyrene and vinylbenzocyclobutene.

6. The method of claim 1 wherein the hard mask is the cured product formed from the hydrolyzed or partially hydrolyzed reaction products of substituted alkoxysilanes or substituted acyloxysilanes.

7. The method of claim 6 wherein the hard mask comprises the hydrolyzed reaction product of a substituted alkoxy or acyloxy silane of the formula:

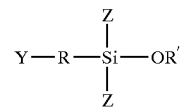

wherein R is $C_1$–$C_6$ alkylidene, $C_1$–$C_6$ alkylene, arylene, or a direct bond; Y is $C_1$–$C_6$ alkyl, $C_2$–$C_6$ alkenyl, a $C_{2-6}$ alkynyl, a $C_6$–$C_{20}$ aryl, 3-methacryloxy, 3-acryloxy, 3-aminoethyl-amino, 3-amino, —SiZ$_2$OR', or —OR'; R' is independently, in each occurrence, a $C_1$–$C_6$ alkyl or $C_2$–$C_6$ acyl; and Z is $C_1$–$C_6$ alkyl, $C_2$–$C_6$ alkenyl, $C_{2-6}$ alkynyl, $C_{6-20}$ aryl, or —OR'.

8. The method of claim 1 wherein the dielectric material comprises a polyarylene resin.

9. The method of any of claims 1–8 wherein the dielectric material comprises a pore forming substance that is activated or removed, either simultaneously with or prior to decomposition of the sacrificial material, thereby introducing pores or voids in the layer.

10. The method of claim 9 wherein the pore forming substance is a crosslinked emulsion polymerized copolymer.

11. A semiconducting device comprising an air gap prepared by a method according to any one of claims 1–8.

12. A semiconducting device comprising an air gap prepared by a method according to claim 9.

13. A semiconductor device comprising a substrate layer, one or more conductive layers, at least one layer of a relatively non-porous, organic polymeric insulating dielectric material having a density less than 2.2 g/cm$^3$, and optionally an impermeable organic or inorganic sealing layer, wherein at least some portion of the conductive layer is separated from another portion thereof by at least a partial air gap.

* * * * *